(12) United States Patent
Zhang et al.

(10) Patent No.: US 9,002,493 B2
(45) Date of Patent: Apr. 7, 2015

(54) ENDPOINT DETECTOR FOR A SEMICONDUCTOR PROCESSING STATION AND ASSOCIATED METHODS

(75) Inventors: John H. Zhang, Fishkill, NY (US); Cindy Goldberg, Cold Spring, NY (US)

(73) Assignee: STMicroelectronics, Inc., Coppell, TX (US)

( * ) Notice: Subject to any disclaimer, the term of this patent is extended or adjusted under 35 U.S.C. 154(b) by 509 days.

(21) Appl. No.: 13/401,295

(22) Filed: Feb. 21, 2012

(65) Prior Publication Data

US 2013/0218316 A1   Aug. 22, 2013

(51) Int. Cl.
G06F 19/00 (2011.01)
B24B 37/013 (2012.01)
B24B 49/12 (2006.01)
H01L 21/66 (2006.01)

(52) U.S. Cl.
CPC ............... *B24B 37/013* (2013.01); *B24B 49/12* (2013.01); *H01L 22/12* (2013.01); *H01L 22/26* (2013.01)

(58) Field of Classification Search
USPC ................................. 700/108; 216/59; 33/503
See application file for complete search history.

(56) References Cited

U.S. PATENT DOCUMENTS

| 5,433,651 | A | 7/1995 | Lustig et al. | |
|---|---|---|---|---|
| 6,844,205 | B2 | 1/2005 | Chapman | |
| 7,915,152 | B2 | 3/2011 | Vaudo et al. | |
| 2002/0014673 | A1* | 2/2002 | Leedy | 257/419 |
| 2003/0089679 | A1* | 5/2003 | Chapman | 216/59 |
| 2005/0176174 | A1* | 8/2005 | Leedy | 438/107 |
| 2008/0308221 | A1* | 12/2008 | Michael et al. | 156/247 |
| 2011/0192042 | A1* | 8/2011 | McMurtry et al. | 33/503 |

* cited by examiner

*Primary Examiner* — Robert Fennema
*Assistant Examiner* — Anthony Whittington
(74) *Attorney, Agent, or Firm* — Allen, Dyer, Doppelt, Milbrath & Gilchrist, P.A.

(57) ABSTRACT

A semiconductor processing apparatus includes a semiconductor processing station for a semiconductor wafer, and an endpoint detector associated with the semiconductor processing station. The endpoint detector includes a non-contact probe configured to probe the semiconductor wafer, an optical transmitter configured to transmit an optical signal to the non-contact probe, and an optical receiver configured to receive a reflected optical signal from the non-contact probe. The controller controls the semiconductor processing station based on the reflected optical signal.

31 Claims, 9 Drawing Sheets

| LOT A | | | | VOLTAGE (VOLTS) | | | | |
|---|---|---|---|---|---|---|---|---|
| SLOT ID | WAFER ID | CMP | TOOL | $V_{PRE\ ANNEAL}$ | $V_{POST-ANNEAL}/V_{PRE\ CMP}$ | $V_{POST\ COMP}$ | DELTA 1 | DELTA 2 |
| 3 | 460A1H69SEB1 | P3:85s w/0psi5s,CX100 | E1 | 0.0716 | -0.476 | -0.167 | -0.309 | 0.5476 |
| 11 | 460A1H6H5EF7 | P3:85s w/0psi5s,CX100 | E1 | 0.0566 | -0.512 | -0.149 | -0.363 | 0.5686 |
| 5 | 460A1H6A5EF5 | P3:85s w/0psi5s,CX100 | E2 | 0.0685 | -0.476 | -0.104 | -0.372 | 0.5445 |
| 13 | 460A1H6B5EC4 | P3:85s w/0psi5s,CX100 | E2 | 0.0574 | -0.518 | -0.157 | -0.361 | 0.5754 |
| 8 | 460A1H6G5EB5 | P3:85s w/0psi5s,CX100 | E5 | 0.0626 | -0.494 | -0.139 | -0.355 | 0.5566 |
| 22 | 460A1H6F5EE6 | P3:85s w/0psi5s,CX100 | E5 | 0.0591 | -0.518 | -0.154 | -0.364 | 0.5771 |
| 9 | 460A1H6C5EG6 | P3:85s w/0psi5s,CX100 | E1 | 0.0574 | -0.5 | -0.131 | -0.369 | 0.5574 |
| 16 | 460A1H66SED1 | P3:85s w/0psi5s,CX100 | E1 | 0.0586 | -0.51 | -0.128 | -0.382 | 0.5686 |
| 10 | 460A1H6E5EDA4 | P3:70s w/0psi5s,PC(w TMAH) | E4 | 0.0587 | -0.503 | -0.343 | -0.16 | 0.5617 |
| 17 | 460A1H67SEA0 | P3:80s w/0psi5s,PC(w TMAH) | E4 | 0.0556 | -0.525 | -0.288 | -0.237 | 0.5806 |
| 19 | 460A1H6D5ED5 | P3:90s w/0psi5s,PC(w TMAH) | E4 | 0.0543 | -0.527 | -0.321 | -0.206 | 0.5813 |
| 23 | 460A1H6B5EE2 | P3:90s w/0psi5s,PC(w TMAH) | E4 | 0.0574 | -0.517 | -0.371 | -0.146 | 0.5744 |

FIG. 6

ENDPOINT DETECTOR FOR A SEMICONDUCTOR PROCESSING STATION AND ASSOCIATED METHODS

FIELD OF THE INVENTION

The present invention relates to the field of semiconductor processing, and more particularly, to a detector and method for determining an endpoint when processing a semiconductor wafer.

BACKGROUND OF THE INVENTION

A long standing problem in the art of manufacturing integrated circuits is that of completing a process step and not knowing whether the process step completed successfully. This is also referred to as endpoint detection. If the step did not complete successfully, and the processing of the integrated circuit continues, then it is likely that at the end of the manufacturing process the circuit will not work as designed. Continued processing after a failed process step results in wasting the costs of processing after the failed step.

An in-situ chemical-mechanical polishing process monitor apparatus for monitoring a polishing process during polishing of a semiconductor wafer in a polishing machine is disclosed in U.S. Pat. No. 5,433,651. The polishing machine has a rotatable polishing table, and a window embedded within the polishing table. The window enables in-situ viewing of a polishing surface of the semiconductor wafer. A reflectance measurement device is coupled to the window on the underside of the polishing table for measuring a reflected optical signal from the semiconductor wafer. The reflectance measurement device processes the reflected optical signal which is representative of an in-situ reflectance, wherein a prescribed change in the in-situ reflectance corresponds to a prescribed condition of the polishing process. A drawback of this approach is that as technology nodes continue to shrink, the reflectance meets is limit for the dependency of a previous film stack on the semiconductor wafer. In other words, the optical signal from the reflectance measurement device travels through a very thin film so that it is not properly reflected back to the reflective measurement device.

As an alternative to a reflective measurement device used for endpoint detection that relies on a reflected optical signal, measured surfaced voltages may be used. U.S. Pat. No. 6,844,205 discloses a system that detects the clearing of a dielectric at a plurality of contact sites by measuring the surface voltage of the dielectric, and comparing the surface voltage to a reference voltage set to a value that relates to the cleared contact sites. A non-contact probe measures surface voltage of the semiconductor wafer during removal of the dielectric. The non-contact probe may be a Kelvin probe, for example.

Even in view of the advances made in determining endpoint detection when processing semiconductor wafers, there is still a need to improve how endpoint detection is determined. This is particularly so as semiconductor processes continue to achieve smaller line widths to create semiconductor wafers with greater capacity.

SUMMARY OF THE INVENTION

In view of the foregoing background, it is therefore an object of the present invention to provide an endpoint detector associated with a semiconductor processing station that efficiently determines endpoints when processing a semiconductor wafer.

This and other objects, features, and advantages in accordance with the present invention are provided by a semiconductor processing apparatus comprising a semiconductor processing station for a semiconductor wafer, and an endpoint detector associated with the semiconductor processing station. The endpoint detector includes a non-contact probe configured to probe the semiconductor wafer, an optical transmitter configured to transmit an optical signal to the non-contact probe, and an optical receiver configured to receive a reflected optical signal from the non-contact probe. A controller is configured to control the semiconductor processing station based on the reflected optical signal.

The semiconductor wafer may comprise a substrate and at least one layer thereon to be processed. The controller may be further configured to generate a surface potential profile of the at least one layer based on the reflected optical signal to control the semiconductor processing station. The controller may comprise a memory configured to store a plurality of surface potential profiles corresponding to a plurality of different type processed layers, and the controller may be further configured to control the semiconductor processing station based on comparing the generated surface potential profile to the stored plurality of surface potential profiles.

The controller may be further configured to generate a height profile of the at least one layer based on the reflected optical signal to control the semiconductor processing station. Similarly, the controller may comprise a memory configured to store a plurality of height profiles corresponding to a plurality of different type processed layers, and the controller may be controller being further configured to control the semiconductor processing station based on comparing the generated height profile to the stored plurality of height profiles.

This approach for endpoint detection is advantageously performed in-situ during the processing, and in a non-contact manner. The endpoint detection is based on a delta change in the generated surface potential profile and/or a delta change in the height profile during each process step. Since different profiles correspond to different process steps, the profiles can be used to identify completion of a process step. Moreover, the surface charge measurements are independent of the tools and methods used to generate the profiles.

Another aspect is directed to a method for operating a semiconductor processing apparatus as discussed above for a semiconductor wafer, and an endpoint detector associated with the semiconductor processing station, as also discussed above. The method may comprise positioning the non-contact probe adjacent the semiconductor wafer, operating the optical transmitter to transmit an optical signal to the non-contact probe, operating the optical receiver to receive a reflected optical signal from the non-contact probe, and operating the controller to control the semiconductor processing station based on the reflected optical signal.

BRIEF DESCRIPTION OF THE DRAWINGS

FIG. 6 is a table illustrating semiconductor processing information and measured data from an endpoint detector in accordance with the present invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
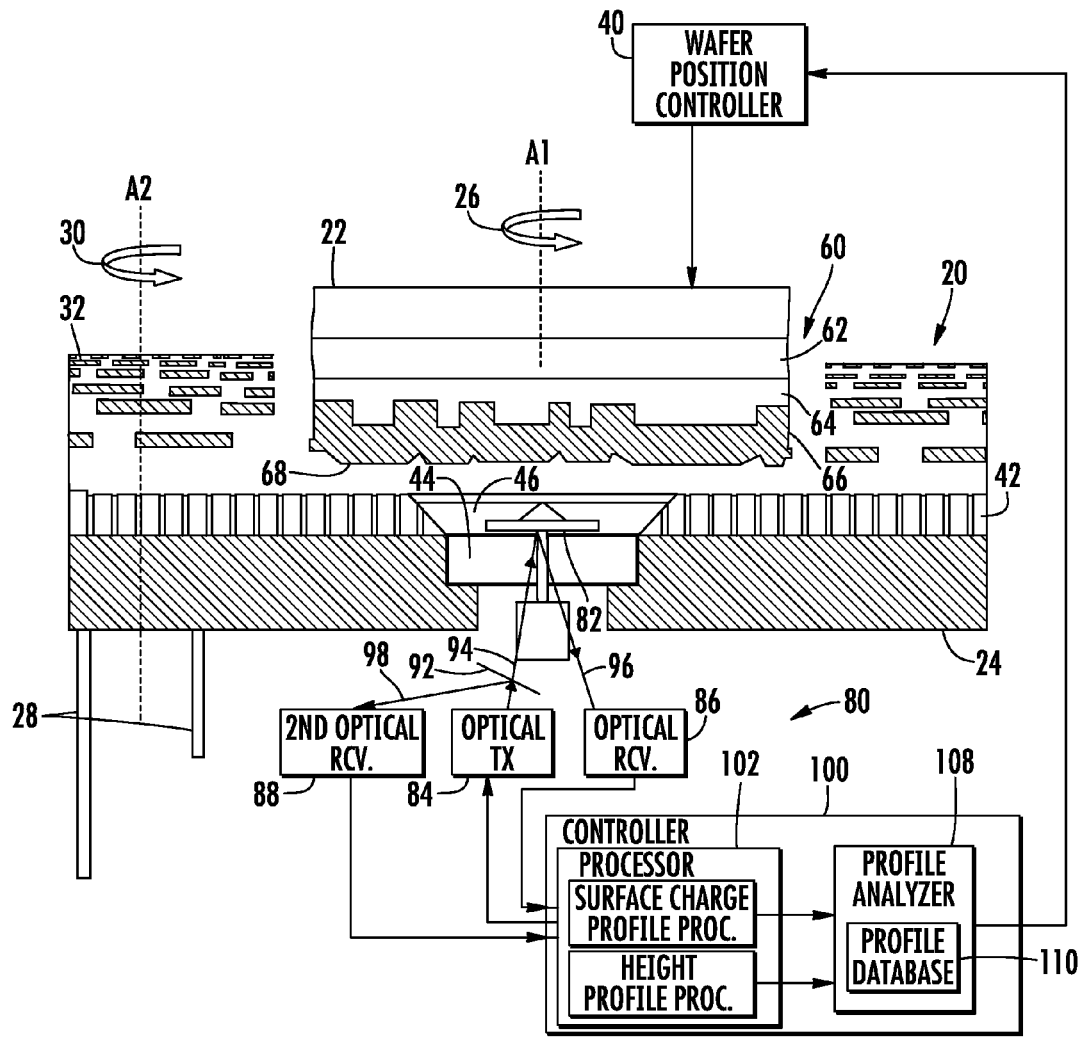
FIG. 1 is a block diagram of a semiconductor processing apparatus in accordance with the present invention.

Referring initially to FIG. 1, a semiconductor processing apparatus 10 includes a semiconductor processing station 20 for a semiconductor wafer 60, and an endpoint detector 80 associated with the semiconductor processing station. A non-contact probe 82 is configured to probe the semiconductor wafer 60, an optical transmitter 84 is configured to transmit an optical signal 94 to the non-contact probe, and an optical receiver 86 is configured to receive a reflected optical signal 96 from the non-contact probe. A controller 100 is configured to control the semiconductor processing station 20 based on the reflected optical signal 96.

As will be explain in greater detail below, the controller 100 includes a processor 102 that processes the reflected optical signal 96 to generate a surface potential profile of a layer 66 on the semiconductor wafer 60 being processed, as well as to generate a height profile of the processed layer 66. Individually or collectively, the surface potential profile and the height profile may be used to control the semiconductor processing station 20.

This approach for endpoint detection is advantageously performed in-situ during the processing, and in a non-contact manner. The endpoint detection is based on a delta change in the generated surface potential profile and/or a delta change in the height profile during each process step. The delta change for a surface potential profile is based on a pre-measurement surface charge value before the process step is performed, and a post-measurement surface charge value after the process step has been performed, wherein a difference between the pre- and post-measurement values corresponds to a particular type process step. Since different profiles correspond to different process steps, the profiles can be used to identify completion of a process step. Moreover, the surface charge measurements are independent of the tools and methods used to generate the profiles. Similarly, a height profile is based on a pre-measurement height value and a post-measurement height value, wherein a difference between the two values also corresponds to the layer being processed.

The delta corresponding to the difference between the pre-measurement and post-measurement surface charge values is independent of a thickness of the layer being processed, which is advantageous as technology nodes continue to shrink. In contrast, if the layer being processed is too thin the layer is being monitored using direct reflectively of optical signals, the light will not be reflected properly to provide accurate endpoint detection information.

The illustrated semiconductor processing station 20 is configured as a chemical-mechanical polishing (CMP) station, as readily appreciated by those skilled in the art. Endpoint detection as discussed herein is not limited to a CMP station, and is applicable to other types of processing stations requiring endpoint detection, such as CVD, RIE, wet clean, and lithography, for example. The semiconductor processing station 20 polishes the semiconductor wafer 60 having a substrate 62 with a dielectric layer 64 thereon for the subsequent formation of metal lines, contact/via studs, and/or pads, for example, is shown. A conformal metal layer 66, comprising copper, for example, overlies the dielectric layer 64. Although not illustrated, the semiconductor wafer 60 can be preprocessed to include layers of interleaved circuitry.

The semiconductor processing station 20 includes a wafer carrier 22 for securing the semiconductor wafer 60 during processing. The semiconductor wafer 60 is positioned between the wafer carrier 22 and a polishing table 24. The wafer carrier 22 is mounted above the polishing table 24 for rotation about an axis A1 in a direction indicated by arrow 26. The polishing table 24 rotates via a table spindle 28 and a corresponding electrically controllable motor about an axis A2 in a direction indicated by arrow 30. A polishing slurry 32 is also provided during the processing.

The wafer carrier 22 is positionable between a polishing position and a non-polishing position by a position controller 40 according to a start/stop signal from the controller 100 that is part of the endpoint detector 80. In the polishing position, the wafer carrier 22 is positioned so that a polishing surface 68 of the semiconductor wafer 60 is in polishing contact with a polishing pad 42, and the wafer carrier 22 exerts an appropriate pressure upon the polishing pad 42. In the non-polishing position, the wafer carrier 22 is positioned so that the polishing surface 68 is removed from the polishing pad 42.

Still referring to FIG. 1, a viewing window 44 is embedded within the polishing table 24. The viewing window 44 traverses a viewing path during a polishing operation, i.e., during rotation of the polishing table 24, and an enables in-situ viewing of the polishing surface 68 of semiconductor wafer 60 during polishing thereof. The viewing window 44 allows viewing of the polishing surface 68 from an underside of the polishing table 24 while the window traverses beneath the semiconductor wafer 60 during a processing step. More particularly, the viewing window 44 enables in-situ viewing of the polishing surface 68 through a detection region along the viewing path. While only one viewing window 44 is shown, more than one may be included.

The viewing window 44 is embedded within the polishing table 24 so that a top surface of the window is substantially flush with a top surface of the table. The viewing window 44 includes a suitable transparent material, such as quartz, fused silica, sapphire (aluminum oxide) or diamond. The viewing window 44 may have a circumferential dimension on the order of about 5-15 mm, and is of sufficient hardness and thickness to withstand any adverse mechanical effects during polishing. In addition, a viewing aperture 46 is provided in the polishing pad 42 at a location corresponding to the location of viewing window 44. The viewing aperture 46 is has tapered sidewalls so that an upper surface of the aperture has a larger diameter than a lower surface of the aperture.

The endpoint detector 80 will now be discussed in greater detail. The non-contact probe 82 may be any device that can sense a surface voltage on the semiconductor wafer 60 being processed. In one embodiment, the non-contact probe 82 is configured as a Kelvin Probe. As readily understood by those skilled in the art, a Kelvin Probe is a non-contact, non-destructive vibrating capacitor device used to measure the work function difference, or for non-metals, the surface potential, between a conducting specimen and a vibrating tip.

Figure 2:
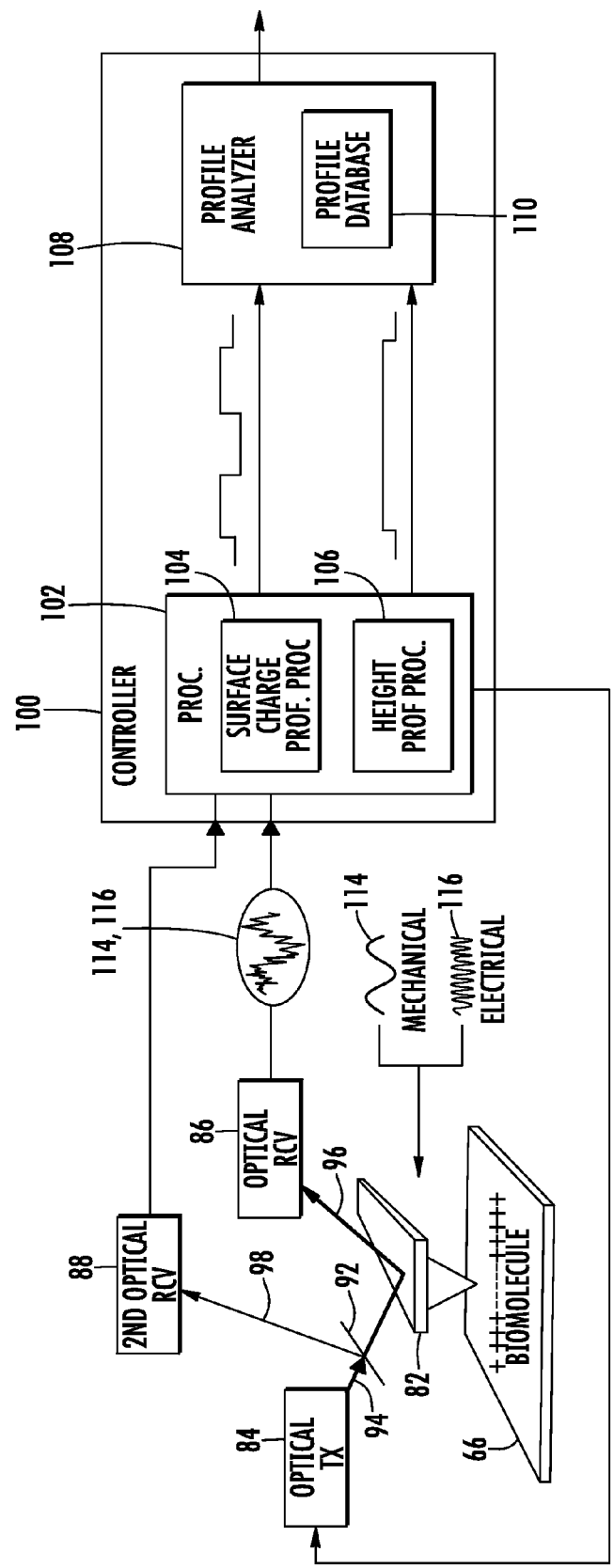
FIG. 2 is a partial block diagram of the semiconductor wafer and the endpoint detector illustrated in FIG. 1.

As more clearly illustrated in FIG. 2, the optical transmitter 84 is configured to transmit an optical signal 94 to the non-contact probe 82, and an optical receiver 86 is configured to receive a reflected optical signal 96 from the non-contact probe. The non-contact probe 82 is adjacent the layer 66 on the semiconductor wafer 60 being processed. To simplify the figure, the polishing table 24 with the viewing window 44 and the polishing pad 42 with the viewing aperture 46 are not shown.

The reflected optical signal 96 is provided to the processor 102 within the controller 100. The reflected optical signal as received by the processor 102 includes a first waveform component 114 corresponding to a measured surface charge, and a second waveform component 116 different from the first waveform component corresponding to a measured height value. The first waveform component 114 corresponds to electrical characteristics of the non-contact probe 82, whereas the second waveform component 116 corresponds to mechanical characteristics of the non-contact probe 82. A frequency of the first waveform 114 corresponding to the electrical characteristics has a higher frequency than a frequency of the second waveform 106 corresponding to the mechanical characteristics.

The processor 102 includes a surface charge profile processing module 104 to processes the first waveform 114 to provide the surface charge profile, and a height profile processing module 106 to processes the second waveform 116 to provide the height profile.

Each of the respective profiles is provided to a profile analyzer 108 within the controller 100. The profile analyzer 108 includes a memory or database of profiles 110 to compare to the currently generated profiles of the layer 66 being processed. As will be discussed in greater detail below, the surface charge profile is different for each process step.

The endpoint detector 80 may also include a beam splitter 92 to split a small portion of the optical signal 94 to a second optical receiver 88. The second optical receiver 88 provides a reference optical signal 98 to the processor 102 when processing the received optical signal 96. The reference optical signal 98 includes less than 20% of the optical signal 94. The profile analyzer 108 is coupled to the position controller 40 for controlling positioning of the wafer carrier 22 between a polishing position and a non-polishing position.

Figure 3:
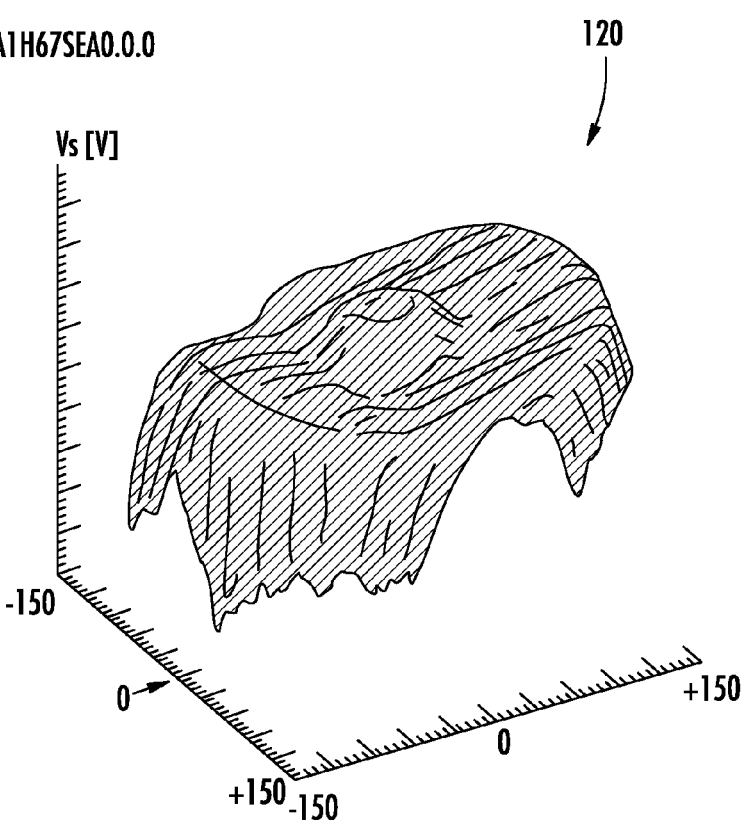
FIG. 3 is a three-dimensional plot of surface charge measurements for a semiconductor wafer after a copper plating process step in accordance with the present invention.
Figure 4:
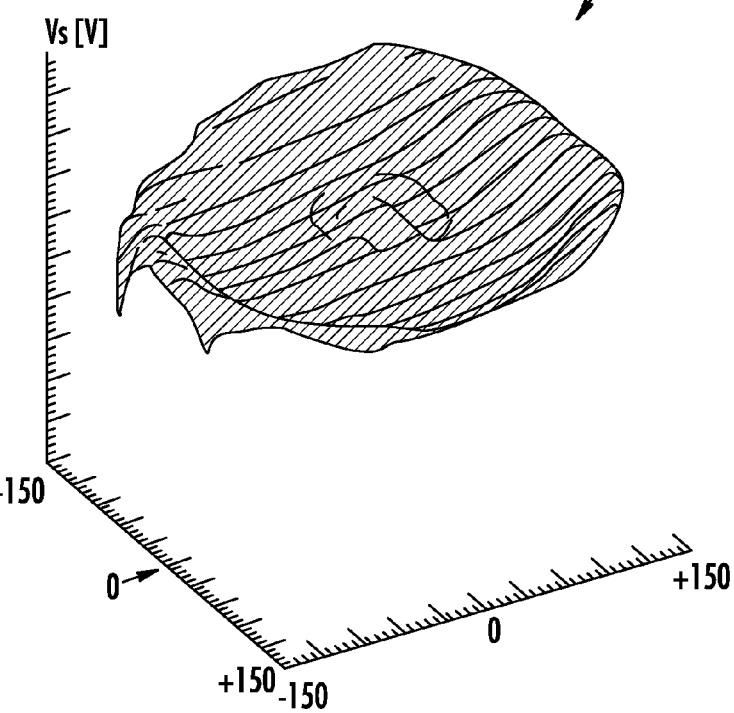
FIG. 4 is a three-dimensional plot of surface charge measurements for a semiconductor wafer after a copper annealing process step in accordance with the present invention.
Figure 5:
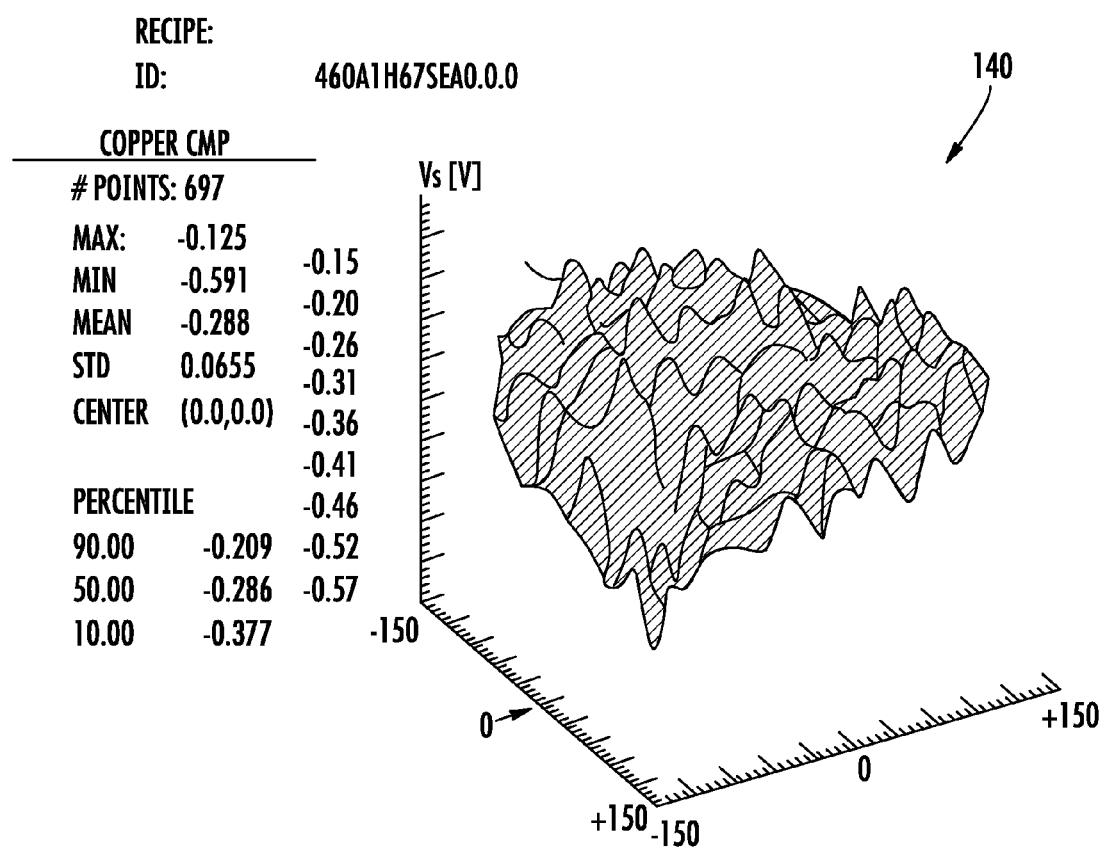
FIG. 5 is a three-dimensional plot of surface charge measurements for a semiconductor wafer after a copper CMP process step in accordance with the present invention.

The different surface charges of the semiconductor wafer 60 after a copper plating process step, a copper annealing process step, and a copper CMP process step will now be illustrated in reference to FIGS. 3-5. These three process steps are for illustration purposes and are not to be limiting. The same endpoint detection as discussed herein equally applies to other types of process steps, as readily appreciated by those skilled in the art.

A three-dimensional plot 120 of the surface charge after copper plating is provided in FIG. 3. The surface charge measurements correspond to a particular semiconductor wafer 60. Out of 697 points that were measured, a voltage of 0.084V corresponds to the $90^{th}$ percentile, a voltage of 0.064V corresponds to the $50^{th}$ percentile, and a voltage of 0.012V corresponds to the $10^{th}$ percentile.

After copper plating, the next process step is copper annealing. A three-dimensional plot 130 of the surface charge after copper annealing is provided in FIG. 4. The surface charge measurements correspond to the same semiconductor wafer 60 used in FIG. 3. Out of 697 points that were measured, a voltage of −0.507V corresponds to the $90^{th}$ percentile, a voltage of −0.527V corresponds to the $50^{th}$ percentile, and a voltage of −0.538V corresponds to the $10^{th}$ percentile. A negative voltage is obtained based on the initial calibration or nulling of an alternating current to a steady state for the non-contact probe 82, as readily understood by those skilled in the art.

After copper annealing, the next process step is a copper CMP. A three-dimensional plot 140 of the surface charge after a copper CMP is provided in FIG. 5. The surface charge measurements correspond to the same semiconductor wafer 60 used in FIGS. 3 and 4. Out of 697 points that were measured, a voltage of −0.209V corresponds to the $90^{th}$ percentile, a voltage of −0.286V corresponds to the $50^{th}$ percentile, and a voltage of −0.377V corresponds to the $10^{th}$ percentile.

Referring now to FIG. 6, a table 150 illustrating semiconductor processing information and measured data from the endpoint detector 80 will now be discussed. Column 150 corresponds to the slot id of the wafer being processed. A device used to hold semiconductors wafers to be processed is sized to hold 25 wafers. Each semiconductor wafer is in a particular slot. Column 152 corresponds to an id of the particular semiconductor wafer being processed. Columns 154 and 156 respectively correspond to the CMP parameters applied to the semiconductor wafers, and the particular tool types used to implement the CMP parameters on the semiconductor wafers.

Column 158 corresponds to pre-measurement surface charge values before the anneal process step is performed. Column 160 corresponds to post-measurement surface charge values after the anneal process step is performed. As noted above, the sequence of processing steps for the illustrated semiconductor wafer 60 may start with copper plating, followed by a copper anneal, and followed by a copper CMP. As readily understood by those skilled in the art, the post-measurement surface charge value in one process step will be the pre-measurement surface charge value in the next sequential process step to be performed. This is illustrated in column 160 where the post-measurement surface charge value after the anneal process step is performed is also the pre-measurement surface charge value before the CMP process step is performed. Column 162 corresponds to post-measurement surface charge values after the CMP process step is performed.

Figure 7:
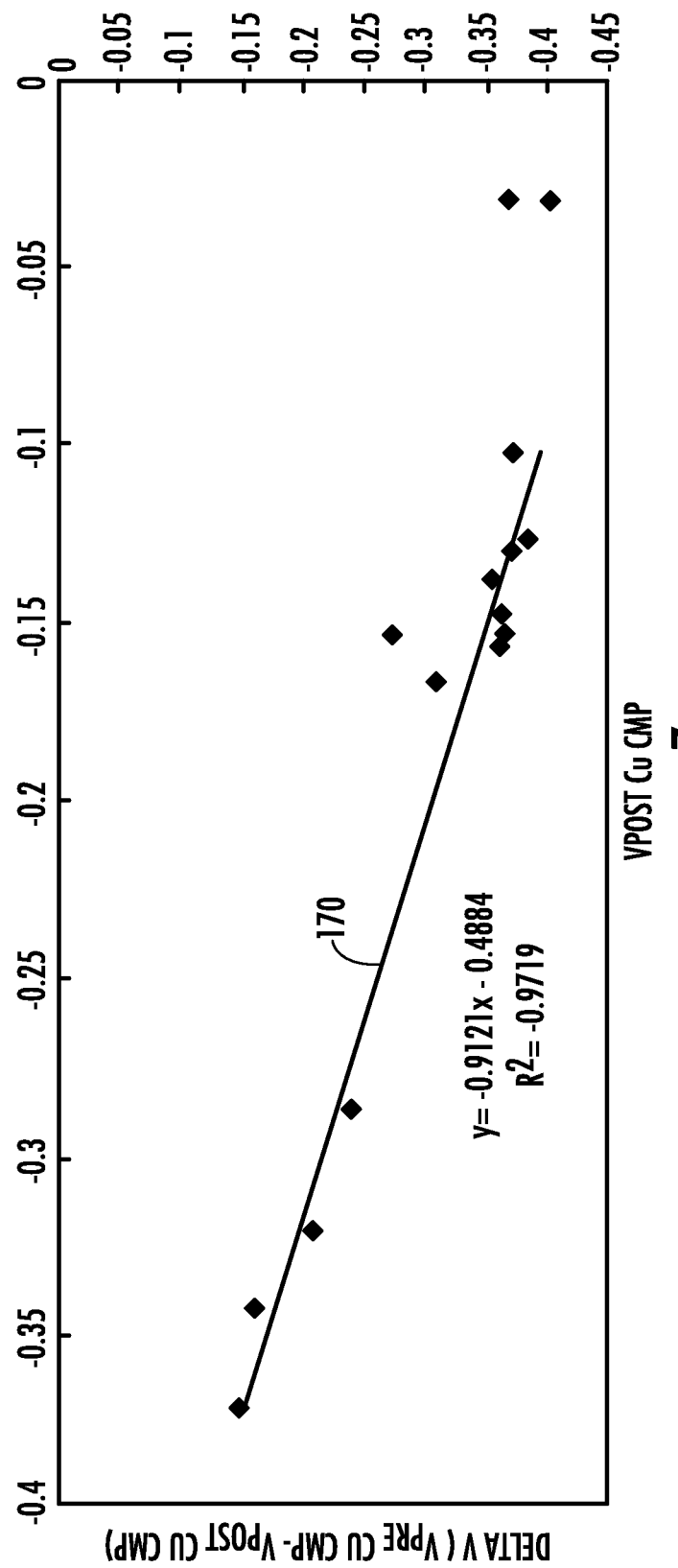
FIG. 7 is a plot of delta changes for pre-measurement and post-measurement surface charge voltages for a copper CMP process step versus post-measurement surface charge voltages in accordance with the present invention.

The delta values in column 164 correspond to the values in column 162 being subtracted from the values in column 160. In other words, the post-measurement surface charge values after the CMP process step is subtracted from the pre-measurement surface charge value before the CMP process step is performed. This delta is a linear relationship as illustrated by line 170 in FIG. 7. The 12 delta values in column 164 are plotted along the line 170. The x-axis is the post-measurement surface charge values after the CMP process, and the y-axis is the delta values from column 164.

Figure 8:
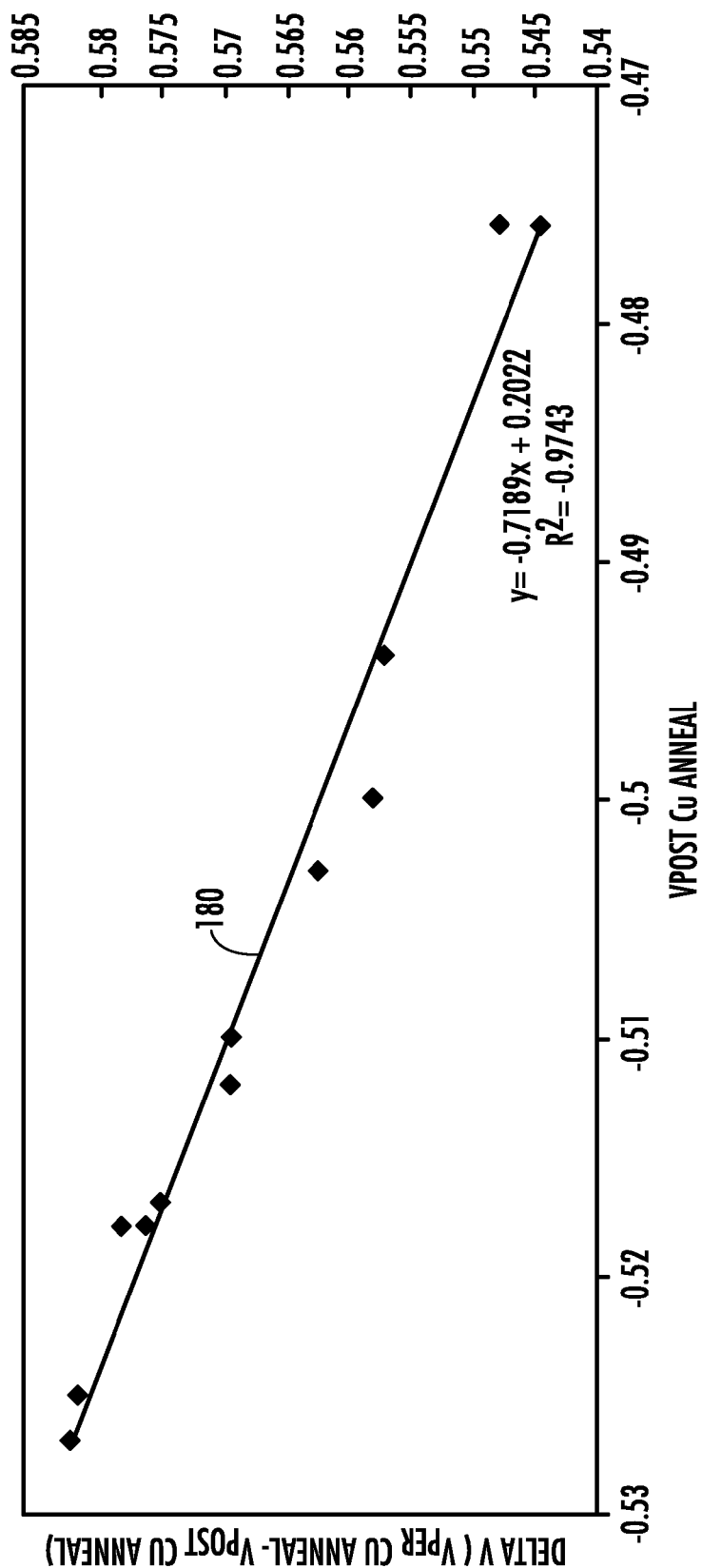
FIG. 8 is a plot of delta changes for pre-measurement and post-measurement surface charge voltages for a copper anneal process step versus the post-measurement surface charge voltages in accordance with the present invention.

Similarly, the delta values in column 166 correspond to the values in column 160 being subtracted from the values in column 158. In other words, the post-measurement surface charge values after the anneal process step is subtracted from the pre-measurement surface charge value before the anneal process step is performed. This delta is a linear relationship as illustrated by line 180 in FIG. 8. The 12 delta values in column 166 are plotted along the line 180. The x-axis is the post-measurement surface charge values after the anneal process, and the y-axis is the delta values from column 166.

Figure 9:
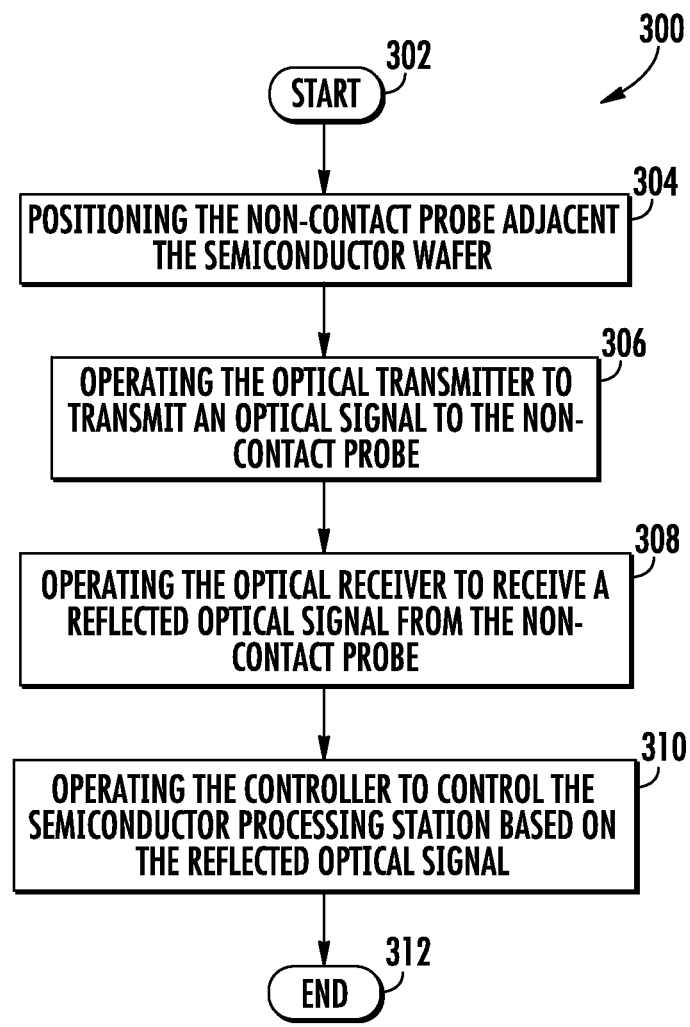
FIG. 9 is a flowchart illustrating a method for operating a semiconductor processing apparatus in accordance with the present disclosure.

A flowchart 300 illustrating a method for operating a semiconductor processing apparatus 20 as described above will now be discussed in reference to FIG. 9. From the start (Block 302), the method comprises positioning the non-contact probe 82 adjacent the semiconductor wafer 60 at Block 304. The optical transmitter 84 is operated to transmit an optical signal 94 to the non-contact probe 82 at Block 306. The optical receiver 86 is operated to receive a reflected optical signal 96 from the non-contact probe 82 at Block 308. The controller 100 is operated at Block 310 to control the semiconductor processing station 20 based on the reflected optical signal. The method ends at Block 312.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor processing apparatus comprising:
   a semiconductor processing station for a semiconductor wafer comprising a substrate and at least one layer thereon to be processed; and
   an endpoint detector associated with said semiconductor processing station and comprising
      a non-contact probe configured to probe the semiconductor wafer,
      an optical transmitter configured to transmit an optical signal to said non-contact probe,
      an optical receiver configured to receive a reflected optical signal from said non-contact probe, and
      a controller configured to generate a surface potential profile of the at least one layer based on the reflected optical signal to control said semiconductor processing station.

2. The semiconductor processing apparatus according to claim 1, wherein said controller comprises a memory configured to store a plurality of surface potential profiles corresponding to a plurality of different type processed layers, and said controller being further configured to control said semiconductor processing station based on comparing the generated surface potential profile to the stored plurality of surface potential profiles.

3. The semiconductor processing apparatus according to claim 1, wherein said controller is further configured to generate a height profile of the at least one layer based on the reflected optical signal to control said semiconductor processing station.

4. The semiconductor processing apparatus according to claim 3, wherein said controller comprises a memory configured to store a plurality of height profiles corresponding to a plurality of different type processed layers, and said controller being further configured to control said semiconductor processing station based on comparing the generated height profile to the stored plurality of height profiles.

5. The semiconductor processing apparatus according to claim 1, wherein said non-contact probe comprises a Kelvin probe.

6. The semiconductor processing apparatus according to claim 3, wherein the reflected optical signal comprises a first waveform component corresponding to the surface potential profile, and a second waveform component different from the first waveform component corresponding to the height profile; and wherein said controller is further configured to process the first and second waveform components.

7. The semiconductor processing apparatus according to claim 1, wherein said semiconductor processing station comprises a chemical-mechanical polishing (CMP) station.

8. The semiconductor processing apparatus according to claim 7, wherein said CMP station comprises a rotatable polishing table and a window embedded therein; and wherein said non-contact probe is positioned adjacent the window.

9. The semiconductor processing apparatus according to claim 8, wherein said window has an upper surface that is substantially coplanar with an upper surface of said table.

10. The semiconductor processing apparatus according to claim 8, wherein said window comprises at least one of quartz, fused silica, sapphire and diamond.

11. An endpoint detector for a semiconductor processing station comprising:
    a non-contact probe configured to probe a semiconductor wafer to be processed by the semiconductor processing station, the semiconductor wafer comprising a substrate and at least one layer thereon to be processed;
    an optical transmitter configured to transmit an optical signal to said non-contact probe;
    an optical receiver configured to receive a reflected optical signal from said non-contact probe; and
    a controller configured to generate a surface potential profile of the at least one layer based on the reflected optical signal to control the semiconductor processing station.

12. The endpoint detector according to claim 11 wherein said controller comprises a memory configured to store a plurality of surface potential profiles corresponding to a plurality of different type processed layers, and said controller being further configured to control the semiconductor processing station based on comparing the generated surface potential profile to the stored plurality of surface potential profiles.

13. The endpoint detector according to claim 11, wherein said controller is further configured to generate a height profile of the at least one layer based on the reflected optical signal to control said semiconductor processing station.

14. The endpoint detector according to claim 13, wherein said controller comprises a memory configured to store a plurality of height profiles corresponding to a plurality of different type processed layers, and said controller being further configured to control the semiconductor processing station based on comparing the generated height profile to the stored plurality of height profiles.

15. The endpoint detector according to claim 11, wherein said non-contact probe comprises a Kelvin probe.

16. The endpoint detector according to claim 11, wherein the semiconductor processing station comprises a chemical-mechanical polishing (CMP) station.

17. A method for operating a semiconductor processing apparatus comprising a semiconductor processing station for a semiconductor wafer comprising a substrate and at least one layer thereon to be processed, and an endpoint detector associated with the semiconductor processing station, the endpoint detector comprising a non-contact probe, an optical transmitter, an optical receiver, and a controller, the method comprising:
    positioning the non-contact probe adjacent the semiconductor wafer;
    operating the optical transmitter to transmit an optical signal to the non-contact probe;

operating the optical receiver to receive a reflected optical signal from the non-contact probe; and operating the controller to generate a surface potential profile of the at least one layer based on the reflected optical signal to control the semiconductor processing station.

18. The method according to claim 17, wherein operating the controller further comprises controlling the semiconductor processing station based on comparing the generated surface potential profile to the stored plurality of surface potential profiles.

19. The method according to claim 17, wherein operating the controller further comprises generating a height profile of the at least one layer based on the reflected optical signal to control the semiconductor processing station.

20. The method according to claim 19, wherein operating the controller further comprises controlling the semiconductor processing station based on comparing the generated height profile to the stored plurality of height profiles.

21. The method according to claim 17, wherein the non-contact probe comprises a Kelvin probe.

22. The method according to claim 19, wherein the reflected optical signal comprises a first waveform component corresponding to the surface potential profile, and a second waveform component different from the first waveform component corresponding to the height profile; and wherein operating the controller further comprises processing the first and second waveform components.

23. The method according to claim 17, wherein the semiconductor processing station comprises a chemical-mechanical polishing (CMP) station.

24. A semiconductor processing apparatus comprising:
a semiconductor processing station for a semiconductor wafer comprising a substrate and at least one layer thereon to be processed; and
an endpoint detector associated with said semiconductor processing station and comprising
a non-contact probe configured to probe the semiconductor wafer,
an optical transmitter configured to transmit an optical signal to said non-contact probe,
an optical receiver configured to receive a reflected optical signal from said non-contact probe, and
a controller configured to generate a height profile of the at least one layer based on the reflected optical signal to control said semiconductor processing station.

25. The semiconductor processing apparatus according to claim 24, wherein said controller comprises a memory configured to store a plurality of height profiles corresponding to a plurality of different type processed layers, and said controller being further configured to control said semiconductor processing station based on comparing the generated height profile to the stored plurality of height profiles.

26. The semiconductor processing apparatus according to claim 24, wherein said non-contact probe comprises a Kelvin probe.

27. The semiconductor processing apparatus according to claim 24, wherein said semiconductor processing station comprises a chemical-mechanical polishing (CMP) station.

28. An endpoint detector for a semiconductor processing station comprising:
a non-contact probe configured to probe a semiconductor wafer to be processed by the semiconductor processing station, the semiconductor wafer comprising a substrate and at least one layer thereon to be processed;
an optical transmitter configured to transmit an optical signal to said non-contact probe;
an optical receiver configured to receive a reflected optical signal from said non-contact probe; and
a controller configured to generate a height profile of the at least one layer based on the reflected optical signal to control the semiconductor processing station.

29. The endpoint detector according to claim 28, wherein said controller comprises a memory configured to store a plurality of height profiles corresponding to a plurality of different type processed layers, and said controller being further configured to control the semiconductor processing station based on comparing the generated height profile to the stored plurality of height profiles.

30. The endpoint detector according to claim 28, wherein said non-contact probe comprises a Kelvin probe.

31. The endpoint detector according to claim 28, wherein the semiconductor processing station comprises a chemical-mechanical polishing (CMP) station.

* * * * *